United States Patent
Jinno

(10) Patent No.: US 6,828,952 B2
(45) Date of Patent: Dec. 7, 2004

(54) DIM-OUT METHOD FOR ORGANIC EL PANEL

(75) Inventor: Yushi Jinno, Gifu (JP)

(73) Assignee: Sanyo Electric Co., Ltd. (JP)

(*) Notice: Subject to any disclaimer, the term of this patent is extended or adjusted under 35 U.S.C. 154(b) by 33 days.

(21) Appl. No.: 10/423,684

(22) Filed: Apr. 25, 2003

(65) Prior Publication Data

US 2003/0214248 A1 Nov. 20, 2003

(30) Foreign Application Priority Data

Apr. 26, 2002 (JP) .......................................... 2002-127014

(51) Int. Cl.$^7$ .............................. G09G 3/36; H01J 1/62
(52) U.S. Cl. .............................. 345/92; 345/88; 345/77; 313/499; 313/501; 313/504; 315/169.3
(58) Field of Search .............................. 345/92, 88, 77, 345/76, 74, 82; 313/499, 501, 504; 315/169.3, 169.4

(56) References Cited

U.S. PATENT DOCUMENTS 5,686,976 A * 11/1997 Nishikawa .................... 349/38
6,097,038 A *  8/2000 Jinno .......................... 257/57

* cited by examiner

Primary Examiner—Tuyet Thi Vo
(74) Attorney, Agent, or Firm—Cantor Colburn LLP

(57) ABSTRACT

A UV laser beam is selectively irradiated on an active layer (semiconductor layer) of a second TFT in a pixel, so as to degrade crystallinity of the active layer and thereby execute electrical disconnection. According to this method, dimming out of pixels can be performed without generating undesirable influences in other components. By directing the laser beam to a portion of the active layer located beneath the gate electrode, the laser beam can be reflected by the gate electrode, allowing execution of a more efficient laser irradiation.

5 Claims, 5 Drawing Sheets

DIM-OUT METHOD FOR ORGANIC EL PANEL

BACKGROUND OF THE INVENTION

1. Field of the Invention

The present invention relates to the repairing of a defective pixel in an electroluminescence (EL) panel.

2. Description of the Related Art

One known type of flat display panel is an EL display panel. As opposed to a liquid crystal display (LCD) panel, an EL display panel is self-emissive. For that reason, and because EL display panels are flat and capable of bright, clear displays, their use is expected to spread widely. In particular, because organic EL elements can be driven at lower voltages compared to inorganic EL elements, widespread use of organic EL elements in various displays is anticipated.

An organic EL display is configured by arranging, in a matrix, a large number of pixels each composed of an organic EL element. While either a passive or active method can be used to drive an organic EL element, use of an active matrix method is considered preferable, as is the case with LCDs. More specifically, in an active matrix method, a switching element is provided for each pixel, and display of each pixel is controlled by controlling the corresponding switching element. In comparison to a passive method in which each pixel is not provided with a discrete switching element, an active matrix method can create a screen display of higher definition, and an active matrix method is therefore preferred.

In an LCD, each pixel is provided with only one switching element (TFT) which is directly connected to a pixel electrode. In an organic EL panel, in contrast, two TFTs and a capacitor are employed for each pixel. FIG. 5 shows an example configuration of a pixel circuit using thin film transistors (TFT) in an organic EL panel. An organic EL panel is configured by arranging such pixels in a matrix.

A gate line GL extending in a row direction is connected to the gate of a first TFT 10, which is an n-channel thin film transistor selected by the gate line GL. The drain of the first TFT 10 is connected to a data line DL extending in a column direction. The source of the first TFT 10 is connected to a storage capacitor CS, which in turn is connected on the other terminal with a capacitor line SL serving as a low-voltage power source. An intermediate point in the connection between the source of the first TFT 10 and the storage capacitor CS is connected to the gate of a second TFT 40, which is a p-channel thin film transistor. The source of the second TFT 40 is connected to a power line VL, while the drain of the second TFT 40 is connected to an organic EL element EL. The other terminal of the organic EL element EL is connected to a cathode power source CV.

With this arrangement, when the gate line GL is at level H, the first TFT 10 is turned on. Data provided in the data line DL at that point is stored in the storage capacitor CS. A current in the second TFT 40 is controlled in accordance with the data (potential) stored in the storage capacitor CS. A current then flows in the organic EL element EL in accordance with the current in the second TFT 40, resulting in light emission.

When the first TFT 10 is turned on, a video signal associated with the pixel is supplied through the data line DL. As a result, the storage capacitor CS is charged in accordance with the video signal supplied through the data line DL. A corresponding current then flows in the second TFT 40, thereby executing brightness control of the organic EL element EL. In other words, display of gradation in each pixel is achieved by adjusting the gate potential of the second TFT 40 so as to control the current flowing in the organic EL element EL.

In an organic EL panel as described above, a defect in the first TFT 10 or the second TFT 40 provided for each pixel may occur during the panel manufacturing process. When a TFT is defective in a manner such that the TFT always disallows a current from flowing in an organic EL element, the corresponding pixel merely generates a dark point among many light-emitting points. As such a point is visually unnoticeable, it is not considered a problem. On the other hand, when a TFT is defective in a manner such that the TFT allows a current to continuously flow in an organic EL element, the corresponding pixel generates a light-emitting point. Even if it is only one pixel, one light-emitting point among surrounding dark or black pixels is noticeable to a viewer and is therefore regarded as a fault. Accordingly, a process of deactivating or "dimming out" a defective pixel that generates a light-emitting point is commonly performed.

Such a process is performed because an organic EL panel including a predetermined number of dark points is not in any way considered an inferior product. By executing a process of dimming out light-emitting points, manufacturing yield of the panels can be greatly enhanced.

The deactivation process can be performed by disconnecting the wiring connected to the defective pixel. As in an LCD, the wiring between the second TFT 40 and the power line or pixel electrode may be disconnected using a visible light YAG laser or the like. In this manner, a light-emitting point can be deactivated, thereby eliminating the fault from the display.

However, when a deactivation process using a visible light YAG laser is executed, there may result damages in the cathode and further effects on display by other pixels. More specifically, in an active matrix type organic EL panel, a pixel is created by disposing a TFT on a glass substrate, forming an ITO anode over the TFT, subsequently laminating organic layers such as a positive-hole transport layer, an organic emissive layer, and an electron transport layer, and then forming a metal cathode over the aforementioned components. As such, a portion of the organic layers and the cathode are positioned above the TFT. In particular, the cathode extends almost entirely over the surface of the panel as the common electrode.

Accordingly, when a any of the TFT wiring is disconnected using a visible light YAG laser, the laser beam penetrates the cathode and often causes ablation or other damage. The resulting configuration of the cathode is such that holes are created at locations where ablation occurred. The ablation may further cause quality in the anode to deteriorate, which may lead to undesirable influence on display by the surrounding pixels. The disconnection by a laser is effected by vaporizing and scattering the substances located where the laser beam is irradiated. Consequently, a side portion of the organic layer of the organic EL element may become directly exposed to the space above the cathode. Degradation of the organic layer due to penetration of moisture, oxygen, or the like in the exposed portion can result in further defective pixels.

Moreover, when wiring is disconnected by ablation, the once scattered wiring material (typically metal) may attach to other wiring components and generate a short circuit.

SUMMARY OF INVENTION

The present invention relates to a dim-out method used in an organic EL panel for effectively dimming out a defective pixel.

According to the present invention, a dim-out process can be performed by irradiating a laser beam on a semiconductor layer of the defective pixel. More specifically, in this process, crystal structure of the semiconductor layer is destructed at a micro level to increase resistance, there by executing electrical disconnection. In this manner, a favorable dim-out process that achieves dimming out of defective pixels basically without damaging other components can be performed.

DESCRIPTION OF PREFERRED EMBODIMENT

A preferred embodiment of the present invention will now be described with reference to the accompanying drawings.

In this first example of the embodiment, a laser beam is irradiated from the underside of a gate electrode of a TFT, so as to allow the laser beam to cause micro-ablation in a semiconductor layer composed of polysilicon positioned beneath the gate electrode. Crystallinity of the semiconductor layer is thereby disintegrated to increase its resistance and lock the TFT in the OFF state. It should be noted that the laser beam is reflected by the gate electrode, such that the laser beam is effectively irradiated on the semiconductor layer without causing undesirable influences in layers located above the gate electrode.

Preferably, the laser employed is an ultraviolet (UV) laser such as a 355 nm YAG laser or a 308 nm excimer laser. If the laser has a longer wavelength, ablation may also be caused in the gate electrode during the process for disintegrating the semiconductor layer. On the other hand, if the laser has a wavelength shorter than the above-referenced wavelengths, the laser beam would have a difficulty transmitting through the glass substrate.

Figure 1:
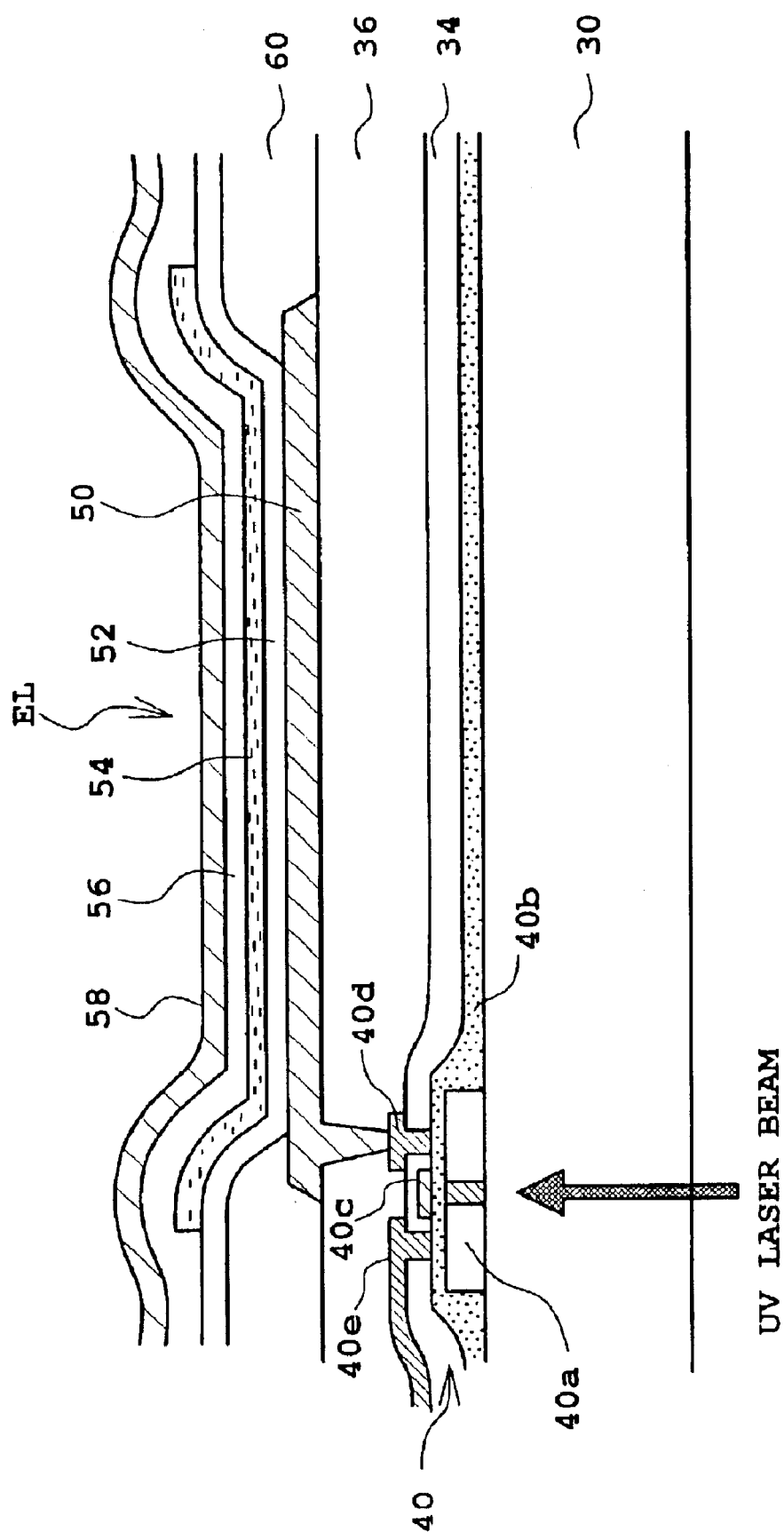
FIG. 1 is a diagram showing a structure of a pixel.
Figure 5:
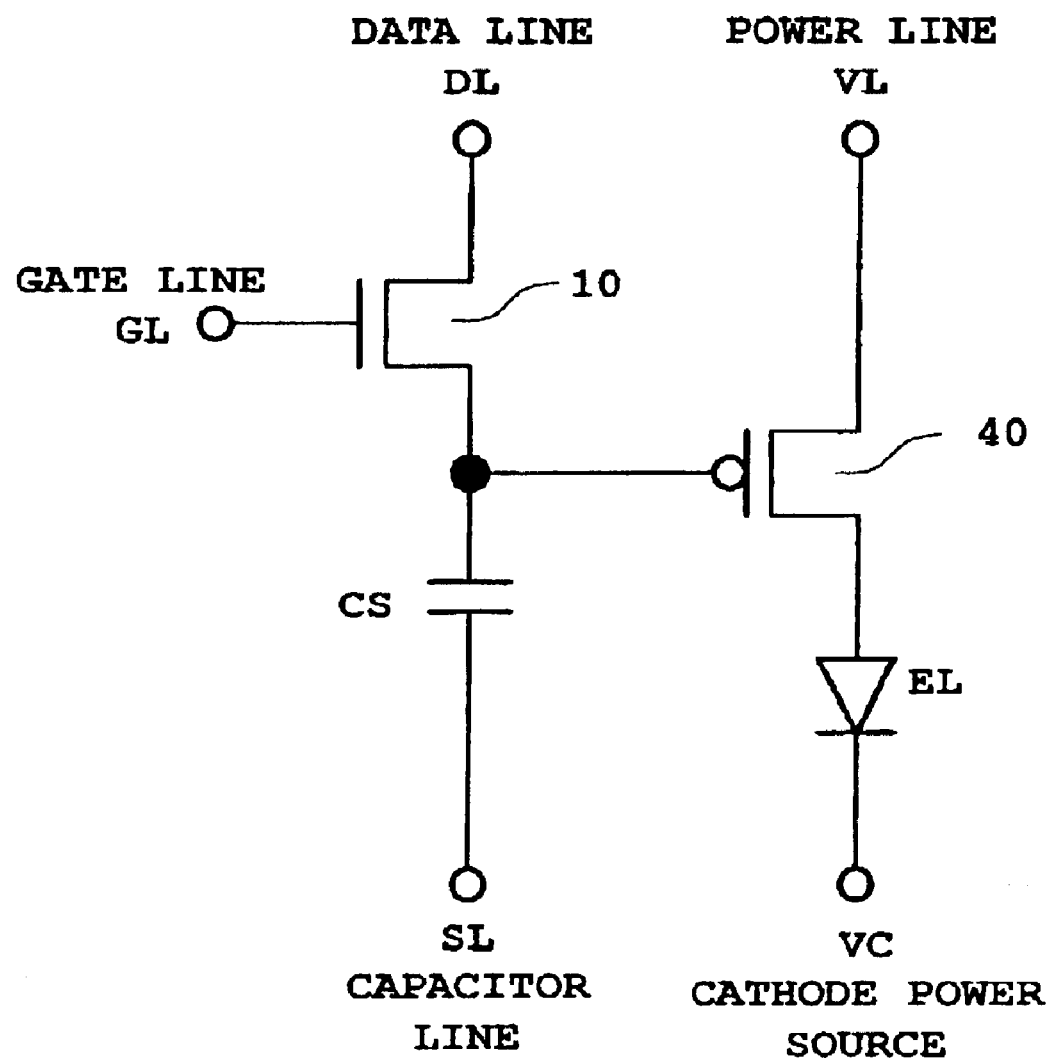
FIG. 5 is a diagram illustrating an example pixel circuit configuration in an organic EL panel.

FIG. 1 illustrates a structure of a pixel. While one pixel actually includes two TFTs 10 and 40, a capacitor CS, and an organic EL element EL as shown in FIG. 5, only the second TFT 40 and the organic EL element EL are shown in FIG. 1.

FIG. 1 shows in detail the structure of the second TFT 40 and the organic EL element EL. As shown, the second TFT 40 is formed on a glass substrate 30. The second TFT 40 comprises an active layer (semiconductor layer) 40a composed of polysilicon. The right and left portions of the active layer 40a are doped with impurities and constitute source and drain regions, respectively. The central portion between the source and drain regions serves as a channel region. A gate electrode 40c is formed over the channel region, with a gate insulation film 40b composed of a silicon insulation film such as silicon oxide interposed therebetween. The gate insulation film 40b and the gate electrode 40c are covered with an interlayer insulation film 34. Formed on the right and left sides of the gate electrode 40c are a source electrode 40d and a drain electrode 40e connected to the source and drain regions, respectively, via contact holes created in the interlayer insulation film 34. The upper ends of the source and drain electrodes 40d and 40e are positioned on the surface of the interlayer insulation film 34.

Also formed on the surface of the interlayer insulation film 34 are components such as a metal wiring connecting the drain electrode 40e and the power line VL. A first planarization film 36 is further formed covering the interlayer insulation film 34.

A transparent electrode 50 composed of ITO is disposed over the first planarization film 36. One end of the transparent electrode 50 is connected to the source electrode 40d of the driving TFT 40 via a contact hole created in the first planarization film 36.

The transparent electrode 50 serves as the anode of the organic EL element. A metal cathode 58 is formed over the transparent electrode 50, while a positive-hole transport layer 52, an organic emissive layer 54, and an electron transport layer 56 are disposed between the anode and the cathode. A second planarization film 60 is positioned contacting the peripheral portions and the sides of the transparent electrode 50. The organic emissive layer 54 is formed slightly larger than the transparent electrode 50 such that a minor alignment error can be tolerated. However, as the organic emissive layer 54 should only be present within the pixel region, the organic emissive layer 54 extends over the second planarization film 60 in only very limited areas. In contrast, the positive-hole transport layer 52 and the electron transport layer 56 are disposed over the entire surface. Alternatively, when the electron transport layer 56 includes an emissive material such as Alq3, the electron transport layer 56 is often disposed within a limited light-emitting section, similarly as the organic emissive layer 54.

Although FIG. 1 shows a bottom emission type organic EL element in which the organic layer is disposed over the transparent electrode 50 and the light is emitted through the substrate, the present invention is not limited to this bottom emission type. The present invention may also be implemented in a top emission type device in which the electrode (normally the cathode) disposed over the organic layer is transparent or translucent, allowing light to be emitted from the upper side of the organic layer. Further, an organic EL panel for which the present invention can be applied may comprise an organic emissive layer which emits a white color, and color filters provided in the individual pixels to perform color display. The organic emissive layer emitting a white color may be composed by laminating an orange-color emissive layer and a blue-color emissive layer. A combination of light emissions from those laminated layers can be used as the white light. It should be noted that this white color EL type device may also be either a bottom emission type or a top emission type.

In an organic EL panel as described above, a light-emitting defective pixel is dealt with by selectively irradiating a shortwave laser beam from under the glass substrate toward the gate electrode 40c. Preferably, the shortwave laser is a YAG laser having a wavelength of 355 nm or an excimer laser of wavelength 308 nm. By this laser irradiation, micro-ablation is caused in the active layer 40a located under the gate electrode 40c to destruct crystallinity and accordingly increase resistance. In this manner, electrical disconnection of the TFT is accomplished to dim out the corresponding pixel. It should be noted that, as the laser beam is reflected by the gate electrode 40c, irradiation of the laser beam on other components can be avoided, allowing electrical disconnection to be executed only in the active layer 40a.

In the above process, a pulse laser is typically used, but a continuous beam may also be employed. A preferred irradiation amount varies depending on the type of the glass substrate and the materials of the organic and other layers. It is preferable to experimentally determine an irradiation amount that reliably executes the deactivation process while minimizing damage to the gate electrode 40c.

Figure 2:
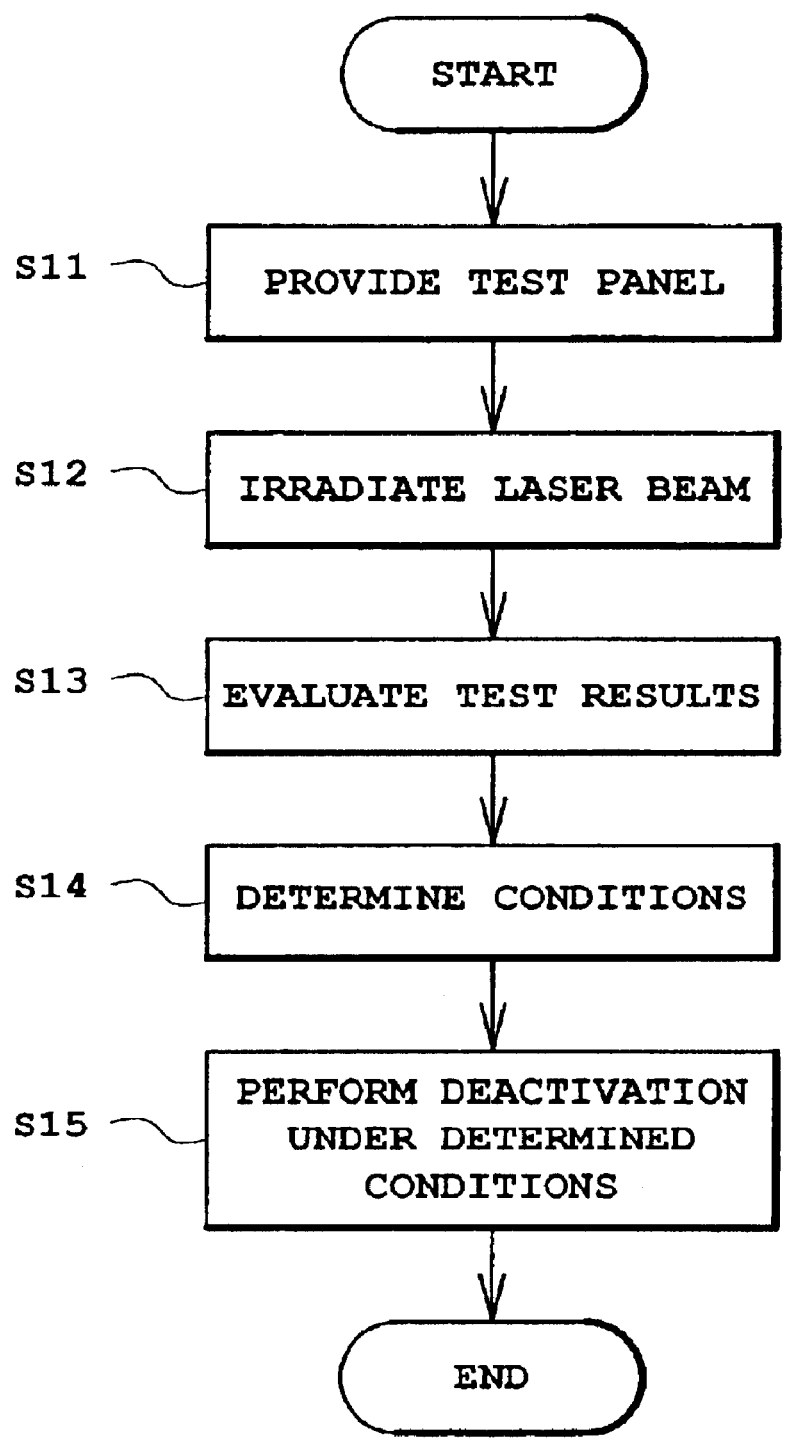
FIG. 2 is a flowchart illustrating one example process for determining laser irradiation amount.

More specifically, as shown in FIG. 2, the irradiation amount may be determined by providing a test panel (S11), irradiating a laser beam in a plurality of pixels while varying irradiation amounts (S12), and then evaluating the results of the laser irradiation test (S13) to verify whether deactivation has been reliably executed. The laser intensity should be set at a level at which no damage is generated in at least the cathode. Subsequently, conditions for reliable execution of the deactivation are determined (S14). For example, an appropriate laser irradiation amount may be selected by measuring a change in emitted light intensity with respect to the pulse irradiation amount.

When the conditions are determined as described above, the conditions are implemented to perform the deactivation process for light-emitting defective pixels in an organic EL panel under actual fabrication (S15).

According to the present embodiment, a pixel dim-out process can be performed by irradiating a laser beam on the active layer 40a located under the gate electrode 40c. In this processing, the crystal structure of the semiconductor layer is disintegrated or destroyed at a micro level to increase resistance, thereby creating electrical disconnection. In this manner, a favorable dim-out process that achieves dimming out of defective pixels basically without damaging other components can be performed.

Figure 3:
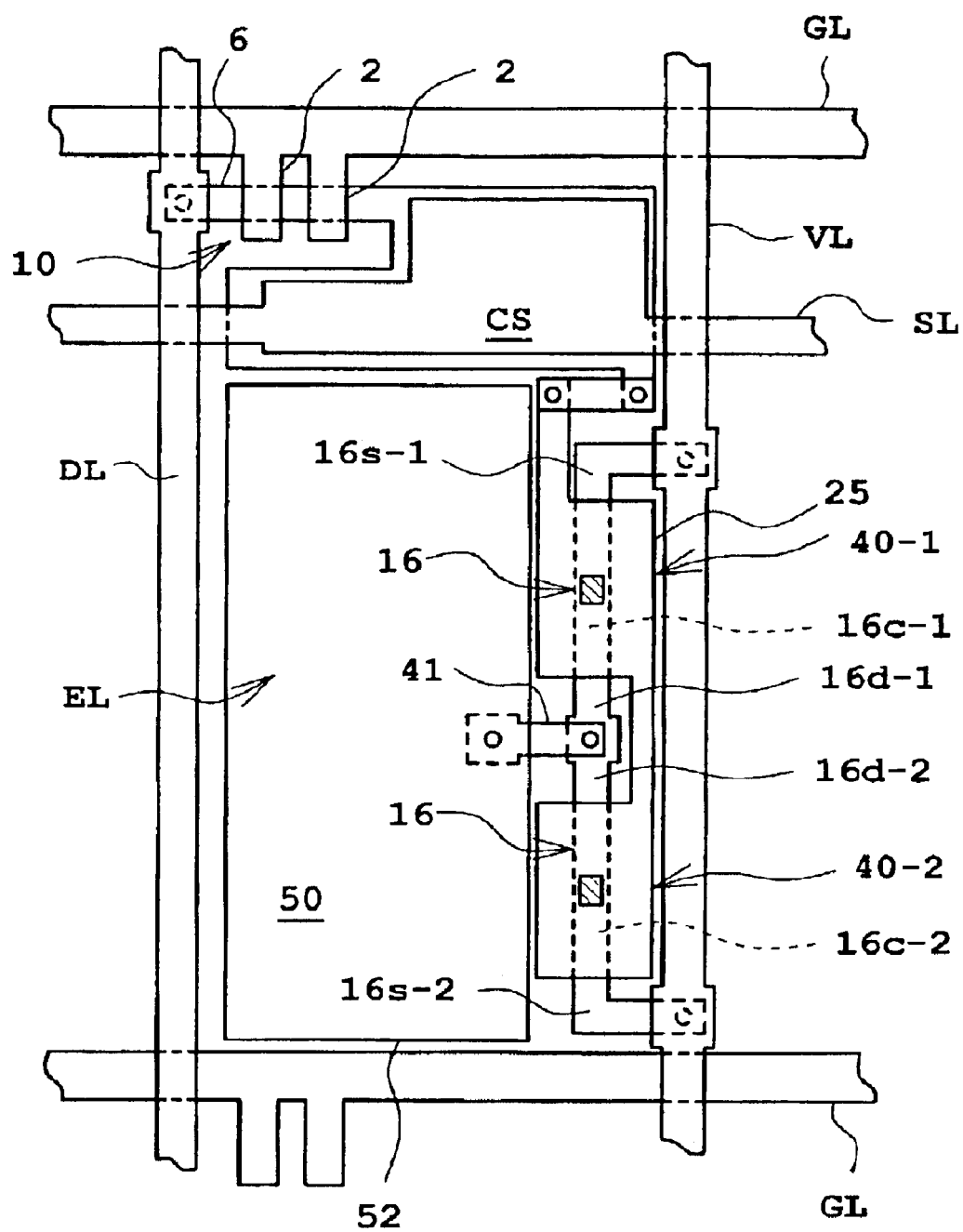
FIG. 3 is a diagram showing a plan view of a pixel.

FIG. 3 shows a plan configuration of one pixel in an organic EL panel. A gate line GL extends in a row direction and connects with the gates 2 of a first TFT 10. The first TFT 10 is of a double-gate type having two gates. The active layer 6 of the first TFT 10 is composed of a polysilicon semiconductor layer. One end (source) of the active layer 6 connects to a data line DL. The other end connects to a lower electrode of a capacitor CS, or alternatively, simultaneously serves as the lower electrode. The portions under the gates 2 of the first TFT 10 constitute the channel regions of the active layer 6. Further, in the active layer 6, the region between the two gates 2 serve as drain and source, while the region connected to the lower electrode of the capacitor CS serve as the source.

In a position opposing the lower electrode of the capacitor CS composed of a semiconductor layer, an upper electrode is formed in a layer approximately equivalent to the gate electrode, with a silicon oxide film disposed between the lower and upper electrodes. The lower electrode, the dielectric member, and the upper electrode constitute the capacitor CS. The upper electrode of the capacitor CS is connected to a capacitor line SL which is maintained at a low potential.

With the above-described structure, when the gate line GL is at level H, the first TFT 10 turns on, allowing a voltage of the data line DL to be written (charged) in the capacitor CS.

The lower electrode of the capacitor CS is connected to the gate 25 of a second TFT 40 via a contact. In this example, the second TFT 40 is configured with two second TFTs 40-1 and 40-2 connected in parallel. In the second TFT 40, the two end portions serve as the sources, while the central portion serves as the drain. More specifically, the second TFT 40 includes an active layer 16, and the sources 16s-1 and 16s-2 at the two ends of the active layer 16 are connected to a voltage line VL via contacts. The active layer portions located under the gate 25 constitute channels 16c-1 and 16c-2, while the central portions serve as drains 16d-1 and 16d-2.

The drains 16d-1, 16d-2 are connected to an organic EL element EL via a contact wiring 41. In other words, the drains 16d-1, 16d-2 of the second TFTs 40-1, 40-2 in FIG. 3 are connected to the anode 50 of the organic EL element.

In the above-described pixel, the second TFT 40 is preferably disconnected by irradiating a laser beam on the active layer (semiconductor layer) 16 located beneath the gate electrode 25. As the second TFT 40 includes two second TFTs 40-1, 40-2 in the present example, the laser beam is irradiated on the channel regions 16c-1, 16c-2 of the active layer 16 to electrically disconnect these regions.

Although the above example refers to irradiating a laser beam in the semiconductor layer located under the gate electrode for electrical disconnection, any other semiconductor layer located under a metal layer may alternatively be processed in a similar manner. For example, it is also preferable to irradiate a laser beam on the source region or the drain region located under the source electrode or the drain electrode for electrical disconnection of those regions.

Further, the above disconnection process may also be performed for the first TFT 10. It is also preferable to disconnect the first TFT 10 from the data line DL by irradiating a laser beam in the connecting contact portion between the data line DL and the semiconductor layer of the first TFT 10.

Reflectance of a laser such as a YAG laser having a wavelength of 355 nm varies depending on the metal on which the laser beam is irradiated. For example, the reflectance by aluminum is approximately 99%, while the reflectance by chromium is approximately 50%. Accordingly, it is preferable that the laser beam be irradiated in a semiconductor layer located beneath a data line DL or the like which is typically composed of aluminum. However, the present invention is not limited to such a configuration. The gate electrodes of the first TFT 10 and the second TFT 40 are typically composed of chromium. It has been experimentally determined that electrical disconnection can be adequately executed in a semiconductor layer located under such a chromium layer. It is noted that metals basically readily reflect a shortwave laser beam. The present process can also be used to electrically disconnect a semiconductor layer positioned below an electrode or wiring composed of molybdenum or the like.

Figure 4:
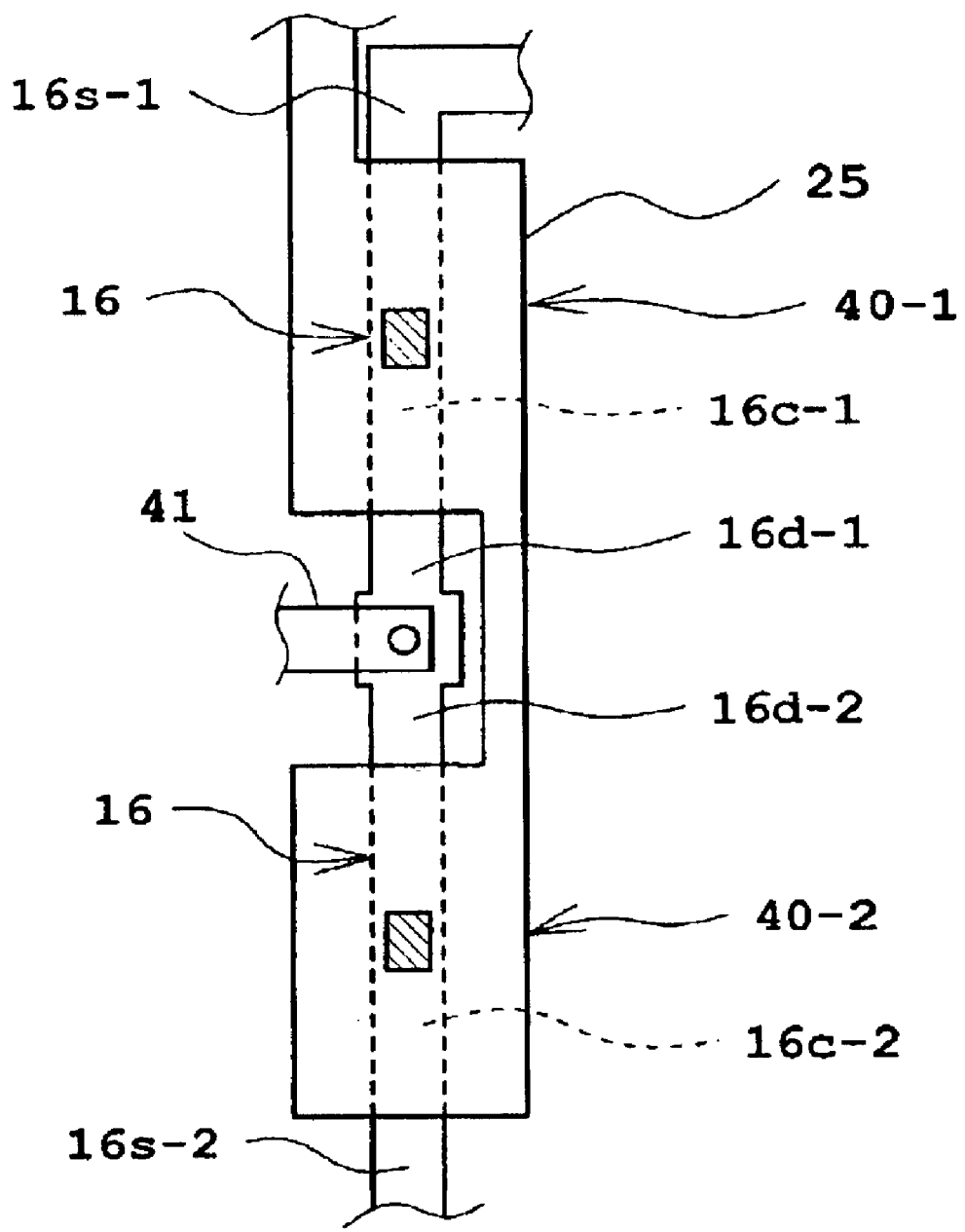
FIG. 4 is a diagram showing an area where a laser beam is irradiated.

In the above-described process, a pixel need not be completely deactivated as long as the amount of light emitted by the pixel is reduced to below a certain level. Accordingly, a laser beam may be irradiated to increase resistance only in one portion of the channel, as shown in FIG. 4.

Although the above explanation was made only in relation to an organic EL panel, the dim-out method of the present invention may also be favorably implemented in other display devices that similarly contain TFTs and other components, such as, for example, a vacuum fluorescence display device.

In summary, according to the present embodiment, a pixel dim-out process can be conducted by irradiating a laser beam on a semiconductor layer of the corresponding pixel. More specifically, in this process, the crystal structure of the semiconductor layer is destructed at a micro level to increase resistance, thereby executing electrical disconnection. In this manner, a favorable dim-out process that achieves dimming out of defective pixels basically without damaging other components can be performed.

In the present embodiment, a thin film transistor includes a semiconductor layer formed on a glass substrate, and a gate electrode arranged over the semiconductor layer, with a gate insulation film disposed there between. The laser beam is preferably irradiated on the semiconductor layer through the glass substrate such that the irradiated laser beam is reflected by the gate electrode. In this manner, laser irradiation on other portions can be avoided, reliably preventing generation of undesirable influences in other components.

The laser beam preferably is a UV laser beam, which achieves electrical disconnection of a semiconductor layer without negatively affecting the metal component.

What is claimed is:

1. A method for dimming out a defective pixel in an EL panel having, in each of pixels arranged in a matrix, an EL emissive element and a thin film transistor for controlling an electric current supplied to the EL emissive element, the method comprising:

selectively irradiating a laser beam on at least one portion of a semiconductor layer constituting the thin film transistor, so as to increase a resistance value of the portion of the semiconductor layer and thereby dim out the corresponding pixel.

2. A dim-out method for an EL panel as defined in claim 1, wherein the laser beam is irradiated from an underside on a portion of the semiconductor layer having a metal layer disposed thereover, such that the irradiated laser beam is reflected by the metal layer.

3. A dim-out method for an EL panel as defined in claim 1, wherein the thin film transistor includes the semiconductor layer formed on a glass substrate, and a gate electrode arranged over the semiconductor layer, with a gate insulation film disposed therebetween; and the laser beam is irradiated on the semiconductor layer through the glass substrate such that the irradiated laser beam is reflected by the gate electrode.

4. A dim-out method for an EL panel as defined in claim 1, wherein the laser beam is a UV laser beam.

5. An EL panel comprising a defective pixel dimmed out by a dim-out method for an EL panel, the method includes selectively irradiating a laser beam on at least one portion of a semiconductor layer constituting a thin film transistor, so as to increase a resistance value of the portion of the semiconductor layer and thereby dim out the defective pixel.

* * * * *